(12) United States Patent
Rispoli et al.

(10) Patent No.: US 11,656,302 B2
(45) Date of Patent: May 23, 2023

(54) EXPANDABLE APPARATUS FOR DETECTING RF SIGNALS AND RELATED METHOD

(71) Applicant: Purdue Research Foundation, West Lafayette, IN (US)

(72) Inventors: Joseph Vincent Rispoli, West Lafayette, IN (US); Jana M. Vincent, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 11 days.

(21) Appl. No.: 17/610,929

(22) PCT Filed: May 12, 2020

(86) PCT No.: PCT/US2020/032518
§ 371 (c)(1),
(2) Date: Nov. 12, 2021

(87) PCT Pub. No.: WO2020/232021
PCT Pub. Date: Nov. 19, 2020

(65) Prior Publication Data
US 2022/0252684 A1    Aug. 11, 2022

Related U.S. Application Data

(60) Provisional application No. 62/846,719, filed on May 12, 2019.

(51) Int. Cl.
*G01R 33/34* (2006.01)
*G01R 33/385* (2006.01)

(52) U.S. Cl.
CPC ........... *G01R 33/34* (2013.01); *G01R 33/385* (2013.01)

(58) Field of Classification Search
CPC ............................ G01R 33/34; G01R 33/385
See application file for complete search history.

(56) References Cited

U.S. PATENT DOCUMENTS

| | | | |
|---|---|---|---|
| 2007/0018647 A1 | 1/2007 | Freytag | |
| 2008/0204021 A1 | 8/2008 | Leussler et al. | |
| 2009/0261828 A1* | 10/2009 | Nordmeyer-Massner | ................... G01R 33/34046 324/318 |

(Continued)

FOREIGN PATENT DOCUMENTS

| | | |
|---|---|---|
| EP | 0579473 A1 | 11/1998 |
| WO | 2018098255 A1 | 5/2018 |

OTHER PUBLICATIONS

International Search Report corresponding to International Patent Application No. PCT/US2020/032518, dated Aug. 11, 2020 (10 pages).

(Continued)

*Primary Examiner* — G. M. A Hyder
(74) *Attorney, Agent, or Firm* — Maginot, Moore & Beck LLP

(57) ABSTRACT

An apparatus for detecting RF signals in magnetic resonance testing procedure includes a multidirectional stretchable fabric and a flexible radio frequency (RF) coil. The flexible RF coil has a coil shape, and comprises conductive fiber stitched into the stretchable fabric in a plurality of repeating, non-linear stitch patterns. The plurality of stitch patterns collectively define the coil shape.

18 Claims, 6 Drawing Sheets

(56) References Cited

U.S. PATENT DOCUMENTS

2013/0072777 A1  3/2013  Tremblay
2018/0372817 A1  12/2018  Rahmat-Samii et al.

OTHER PUBLICATIONS

Nordmeyer-Massner, J et al. "MR imaging of healthy knees in varying degrees of flexion using a stretchable coil array provides comparable image quality compared to a standard knee coil array" European Journal of Radiology; Publication [online]. Dec. 18, 2015 [retrieved Jul. 22, 2020). Retrieved from the Internet <URL: https:1/ www.ejradiology.com/article/S0720-04BX (15)30188-1/fulltext>; DOI: 10.1016/j.erad.2015.12.004; see entire document.

* cited by examiner

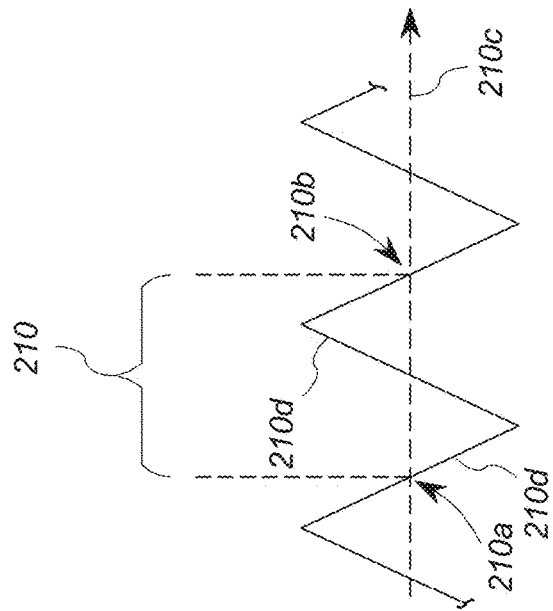
FIG. 3a
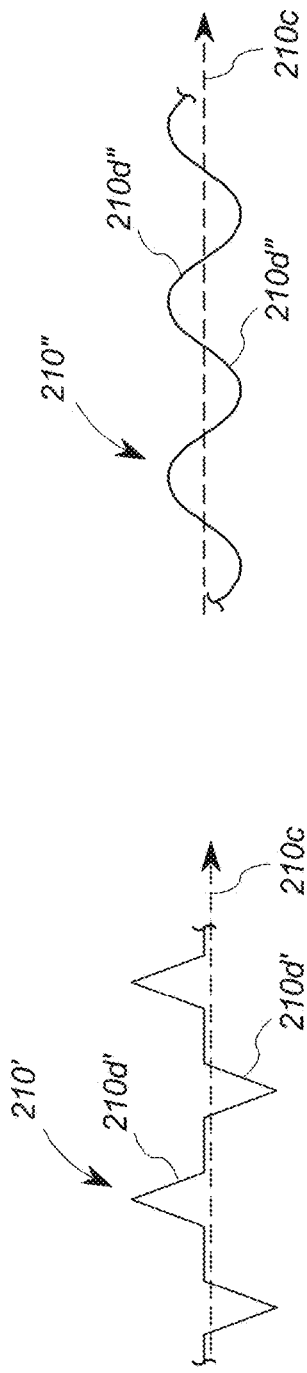
FIG. 3b
FIG. 3c

US 11,656,302 B2

EXPANDABLE APPARATUS FOR DETECTING RF SIGNALS AND RELATED METHOD

This application claims the benefit of U.S. Provisional Patent Application Ser. No. 62/846,719, filed May 12, 2019, which is incorporated herein by reference.

GOVERNMENT LICENSE RIGHTS

This invention was made with government support under funding number EB026231 awarded by the National Institutes of Health. The government has certain rights in the invention.

FIELD OF THE INVENTION

The present invention relates generally to RF detection coils.

BACKGROUND

Radio frequency ("RF") coils play an important role in many testing and measurement applications, including those in the medical field. For example, medical procedures such as magnetic resonance imaging ("MRI") and magnetic resonance spectral imaging ("MRSI") use RF coils to both transmit RF pulses and to detect RF echo pulses. Magnetic resonance imaging or MRI is a medical imaging technique used in radiology to form pictures of the anatomy and the physiological processes of the body. In general, an MRI system transmits a series of RF pulses in an anatomical region of a patient (called the volume of interest), while exposing the volume of interest ("VOI") to select magnetic gradients. The MRI system uses RF coils to detect one or more echo signals, and then constructs images from the echo signals that are indicative of physiological and/or chemical characteristics of the VOI within the patient.

In order to enhance the signal-to-noise ratio ("SNR"), receive coil arrays are shaped to encompass a generalized form of the anatomy of interest. Fixed coil arrays are durable and designed for specific applications, e.g., brain imaging. However, multiple sizes are often desirable to facilitate a closer fit and improve SNR. Researchers have identified flexible coils as a means to improve SNR, with recently-proposed flexible or bendable planar RF coil designs fabricating coil conductors using screen-printing technology, copper braid, and custom coaxial cable. These designs are well-suited for wrapping coil elements around an elliptic cylinder, e.g., the torso or abdomen. However, unidirectionally flexible coils such as those discussed above do not facilitate MRI of convex joints such as the shoulder, knee, and elbow joints.

In particular, millions of patients suffering from joint injuries and degenerative joint diseases, such as arthritis, have difficulty fully extending their joints. With increased life expectancies, it is estimated that more than 78 million individuals in the United States will be diagnosed with arthritis by the year 2040. Generally, commercially available joint-imaging RF coils are rigid and require the subject to lie in a pronated or supine position with the joint fully extended. However, a stretchable knee and wrist coil has been developed utilizing copper braid solder wick on a bandage designed to be stretched as it is wrapped around an area. Copper braiding is bendable but does not stretch, making a universal fit difficult. There is a need for a coil arrangement that that enables comfortable positioning, particularly during lengthy MRI scans and/or MRSI scans, which can range from 20-60 minutes.

SUMMARY OF THE INVENTION

At least some embodiments described herein address one or more of the above stated needs by providing an RF coil formed of a conductive thread stitched into a stretchable fabric in a non-linear pattern.

In a first embodiment, an apparatus for detecting RF signals in magnetic resonance testing procedure includes a multidirectional stretchable fabric and a flexible radio frequency (RF) coil. The flexible RF coil has a coil shape, and comprises conductive fiber stitched into the stretchable fabric in a plurality of repeating, non-linear stitch patterns. The plurality of stitch patterns collectively define the coil shape.

The coil shape may at least in part define the majority of a loop, similar to a loop antenna. In another embodiment, a similar coil is incorporated with a balancing and/or tuning circuit. In other embodiments, the coil described above is incorporated in a magnetic resonance system such as an MRI system.

The above described features and advantages, as well as others, will become more readily apparent to those of ordinary skill in the art by reference to the following detailed description and accompanying drawings.

BRIEF DESCRIPTION OF THE DRAWINGS

FIG. 3*a* shows a top plan view of a first exemplary stitch pattern that may be used in the RF detection apparatus of FIG. 2;

FIG. 3*b* shows a top plan view of a second exemplary stitch pattern that may be used in the RF detection apparatus of FIG. 2;

FIG. 3*c* shows a top plan view of a third exemplary stitch pattern that may be used in the RF detection apparatus of FIG. 2;

DETAILED DESCRIPTION

Figure 1:
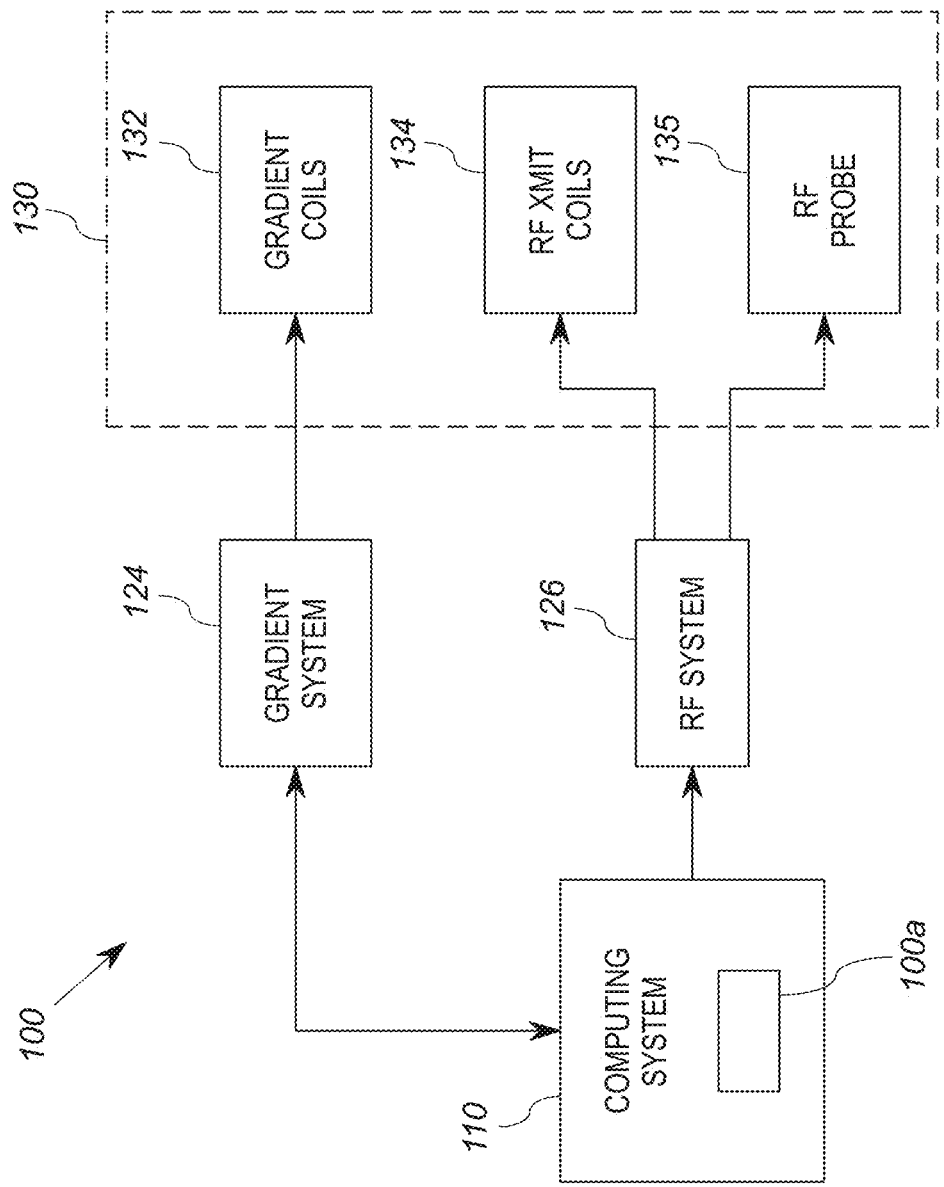
FIG. 1 shows a schematic block diagram of an exemplary magnetic resonance imaging system that incorporates an RF probe according at a first embodiment.

FIG. 1 shows a schematic block diagram of a magnetic resonance system 100 according to a first embodiment. While the magnetic resonance system 100 is a medical diagnostic imaging system that may take multiple forms, in this example the system 100 is an MRI system 100. The MRI system 100 includes a computing system 110, a gradient system 124, an RF system 126, and an MRI chamber 130. The MRI chamber 130 is a known instrument configured to receive a human patient, not shown, and includes gradient coils 132, RF coils 134, and one or more RF probes 135.

In general, the MRI system 100 operates to apply a series of RF pulses and magnetic gradients to a patient subject within the chamber 130 using known MRI techniques. The MRI system 100 is configured to record responsive RF signals generated by the reaction of the nuclei in the subject to the applied RF pulses and magnetic gradients. In accordance with the embodiments described herein, the MRI system 100 is configured to generate MRI imaging data for storage subsequent (or real-time) display. The computing system 110 is configured to display representations of MRI data in a display 100a.

The computing system 110 includes at least one programmable processing device, which executes computer instructions stored in a non-transitory storage medium, to carry out the operations attributed to the computing system 110 herein. The computing system 110 may take a plurality of forms and may include a plurality of computing devices, servers, workstations, and/or portable computing devices and the like. The computing system 110 includes an operator interface that enables scan prescriptions to be entered into the MRI system 100, as is known in the art. The scan prescriptions dictate the sequence of operations of, for example, the gradient system 124 and the RF system 126 to generate pulses necessary for a desired MRI operation, as known in the art.

The computing system 110 is configured to operate the gradient system 124 and a radiofrequency ("RF") system 126 in response to instructions entered by a user or downloaded from one or more files. The computing system 110 is configured to carry out the various functions that convert raw MRI signals to MRI imaging data.

The gradient system 124 is an electrical device that is operably coupled to provide gradient waveforms to excite gradient coils 132 within the MRI chamber 130 to produce magnetic field gradients on the volume of interest ("VOI"). The gradient system 124 is configured to generate the gradient waveforms responsive to gradient signals received from the computing system 100, which can include a pulse sequence server. The gradient coils 132 are electromagnetic coils disposed throughout the chamber 130 that are configured collectively to generate magnetic gradients in three dimensions, in response to the gradient waveforms received from the gradient system 124. The magnetic gradients serve the purpose of localization, or in other words selecting the VOI that will produce the MRI signals.

Suitable pulse sequence servers, gradient systems and corresponding coil configurations generally capable of generating magnetic field gradients within an MRI chamber 130 are known in the art and may take multiple forms. For example, suitable pulse sequence servers, gradient systems and gradient coils can be found in a Siemens Prisma 3-Tesla MRI scanner, a 3-tesla model Discovery MR750, available from GE Healthcare, Chicago, Ill., USA, as well as other models.

The RF system 126 is a circuit that both generates RF pulses on RF coils 134 within the chamber 130, and receives echo RF signals from the RF probe 135. The acquired MRI signal can then be provided to the computing system 110. The RF coil 134 in some embodiments may suitably be a whole body coil used in many MRI chambers 130 for transmitting RF pulses from the RF system 126.

The RF probe 135 in this embodiment includes at least one multidirectionally stretchable RF coil disposed on a multidirectionally stretchable fabric. As will be discussed below, the RF probe 135 may suitably comprise conductive fiber stitched into the stretchable fabric in a plurality of repeating, non-linear stitch patterns. Further details regarding an exemplary embodiment of such a coil and the stretchable fabric are provided below in connection with FIG. 2. The RF probe 135 may in some cases include multiple RF coils attached to the stretchable fabric. The RF probe 135 is disposed proximate to and around the portion of the anatomy of interest. To this end, the flexible fabric of the at least one could may be stretched over a joint (knee, ankle, elbow, shoulder, hip, etc.) of the subject, or over other tissue, such as breast tissue.

The RF system 126 is configured to generate excitation waveforms and provide the excitation waveforms to the RF coil 134 to perform the prescribed magnetic resonance RF pulse sequence. The RF system 126 thus includes a transmitter that is responsive to the scan prescription and direction from the computing system 110 to produce RF pulses of the desired frequency, phase and pulse amplitude waveform.

The RF probe 135 is configured to detect responsive MRI signals. The RF system 126 is further configured to amplify, demodulate, filter and digitize the received MRI raw signal, and provide a digitized MRI signal the computing system 110. As discussed above, the computing system 110 is configured to receive the MRI signals and generate the MRI image data based on the digital MRI signals received from the RF system 126.

Images reconstructed by the computing system 110 are stored and can be selectively displayed. For example, an operator may use the computing system to archive the images, produce films, or send the images via a network to other facilities.

Figure 2:
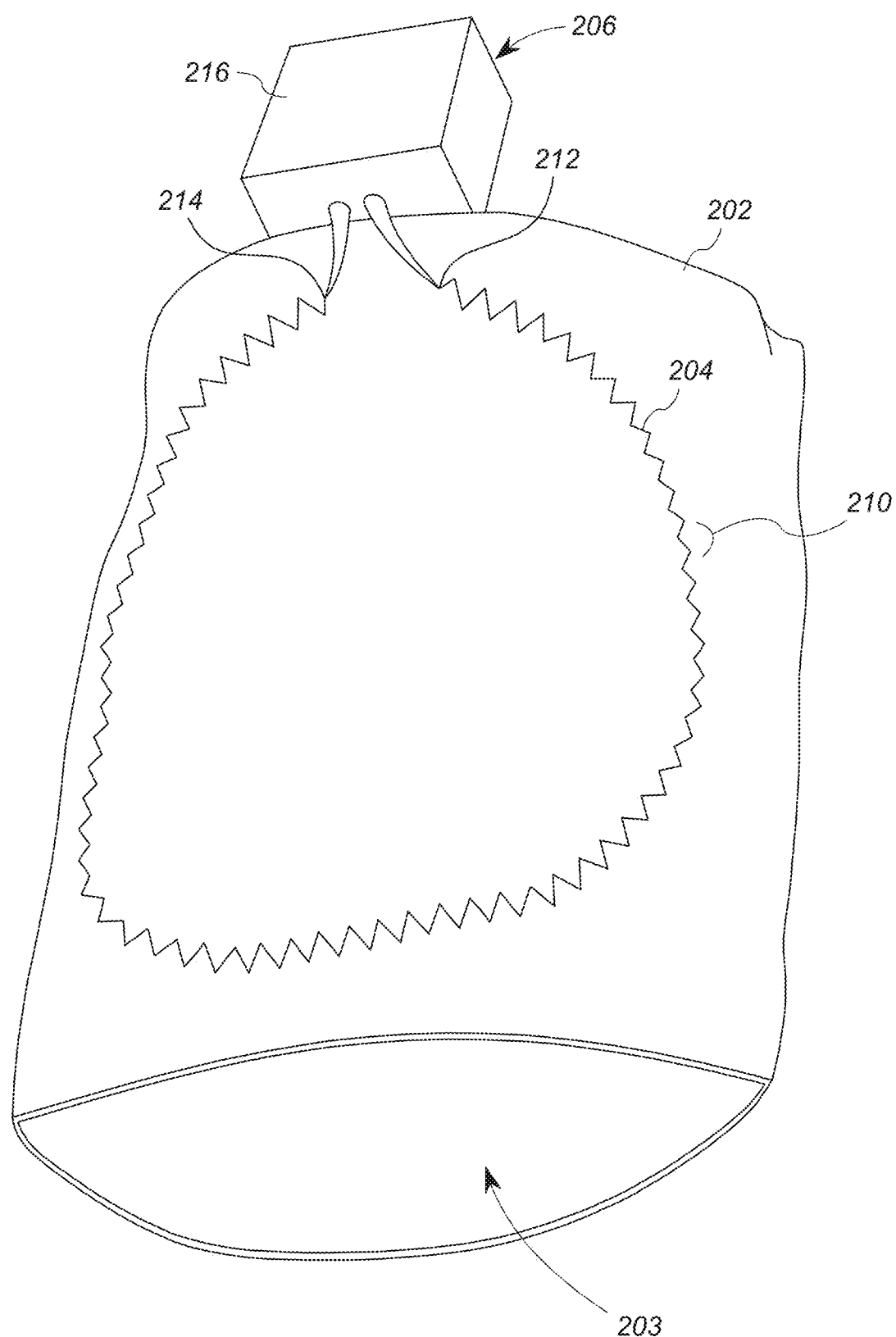
FIG. 2 shows a perspective view of an exemplary embodiment of the RF detection apparatus that may be used as the RF probe in the system of FIG. 1.

FIG. 2 shows a perspective view of an exemplary embodiment of the RF detection apparatus 200 that may be used as the RF probe 135 of FIG. 1. The apparatus 200 includes a sleeve 202 or other tubular fabric member, a flexible RF coil 204, and a tuning/matching circuit 206. In this embodiment, the apparatus 200 detects RF signals in magnetic resonance testing procedures. For many 1.5 T and 3 T MRI applications, the apparatus 200 detects RF signals in the range of 20 MHz to 500 MHz. The RF probe 135 is configured for a particular subset of frequencies. However, the design of the RF probe 135 can be modified to accommodate the entire range of MRI and MRSI frequencies. In some cases, the flexible RF coil 204 can be designed to interconnect with any one of a plurality of tuning/matching circuits 206, each tuning/matching circuit configured to combine with the RF coil 204 to have a suitable resonant frequency at the Larmor frequency of interest for the specific MRI test (and the MRI system on which it is used). However, it is preferable to alter the (nominal) geometry of the coil itself (e.g. different radius) to adjust for different frequencies of interest.

The sleeve 202 is formed at least in part, and preferably completely, of a multidirectionally stretchable fabric. In one embodiment, the fabric may be 10% spandex and 90% polyester. The sleeve 202 defines an interior 203 and is configured to fit snugly around a portion of the human body that is adjacent to an anatomical area of interest. For example, for MRIs of the knee, the sleeve 202 is sized to fit tightly around the leg at the knee joint, with the knee joint in the interior 203. For MRIs of the breast, the sleeve 202 can be sized to fit over and around the upper torso. In other embodiments, instead of a sleeve, the fabric may be used in a shirt, cap, pant leg or undergarment formed of a multidimensionally stretchable fabric in which is stitched one or more flexible RF coils 204.

The flexible RF coil 204 in this embodiment comprises conductive fiber stitched into the stretchable fabric 202 in a plurality of repeating, non-linear stitch patterns 210. The coil 204 defines a nominal shape (e.g. a loop) that is the overall shape of the coil 204, irrespective of the shape of the individual stitch patterns 210. The non-linear stitch patterns 210 collectively form the nominal shape, which in this embodiment is a loop. The loop need not be precisely circular. In this embodiment, the loop coil 204 extends between a quarter way and half way around the circumference of the sleeve 202. In other cases, the nominal shape of the coil 204 could be any shape associated with dipole antennae, linear antennae or the like.

In the example of FIG. 2, the stitch pattern is a zig-zag pattern. The stitch pattern 210 is shown in greater detail in FIG. 3a. As shown in FIG. 3a, each stitch pattern 210 includes a first end 210a and a second end 210b defining a travel direction 210c therebetween. The travel direction 210c defines the segment of the coil shape formed by the stitch pattern 210. The stitch pattern 210 includes elements that do not extend directly in the travel direction 210c, but rather form wavelets 210d that extend at angles away from and back toward the travel direction 210c. The wavelets 210d in this form a triangle wave. It will be appreciated that the stitch pattern may take other shapes having the non-linear wavelet characteristic, such another triangular wavelet pattern, such as the pattern 210' of FIG. 3b, sine wave patterns, or other rounded patterns, such as the pattern 210" of FIG. 3c. The wavelets 210d in all cases facilitate the expandability.

The conductive fiber of the coil 204 includes a nonferromagnetic conductor disposed about a nonconductive thread, for example, coaxially. The nonferromagnetic conductor may suitably comprise silver, and the nonconductive thread may suitably comprise polyester. The conductive outer layer preferably has a thickness of 3 to 6 skin depths at the frequency of interest. In this embodiment, the frequency of interest for many MRI procedures is between 120 MHz and 300 MHz.

Referring again to FIG. 2, the coil 204 further includes a first end 212 and a second end 214, which are operably coupled the tuning/matching circuit 206, which in FIG. 2 is disposed within a housing 216. In this embodiment, when the sleeve 202 is laid flat, it can be stretched by a radius of at least 115% and preferably up to 130% of its draped or unstretched radius, and adequately receive RF signals in the MRI setting. As a result, the apparatus 200 may be used to on patients with a range of anatomical sizes, and still achieve close spacing between the coil 204 and the anatomical area of interest, using the tight fit of the sleeve 202.

Figure 4:
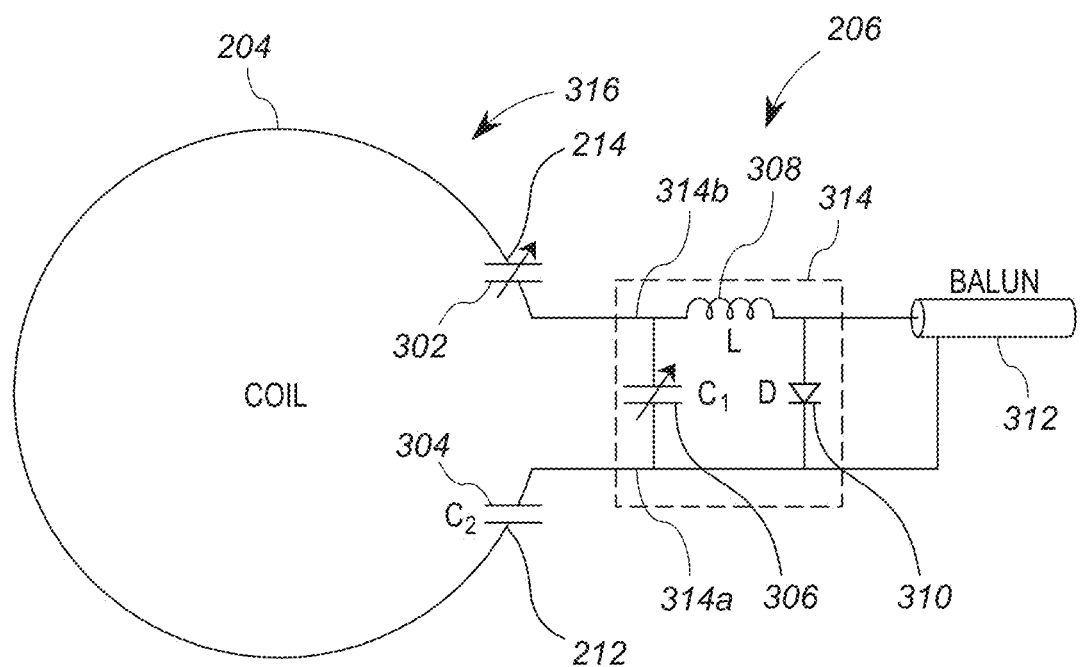
FIG. 4 shows a schematic diagram of the RF detection apparatus of FIG. 2.

In general, the tuning/matching circuit 206 includes elements that form a tunable resonator with the coil 204, and an impedance matching circuit that also acts as a current trap. FIG. 4 shows a schematic diagram of an exemplary embodiment of the tuning/matching circuit 206 of FIG. 2, in context with the coil 204.

With reference to FIG. 4, the tuning/matching circuit 206 includes a variable tuning capacitor 302, a resonator capacitor 304, a second variable capacitor 306, and inductor 308, a diode 310, and a balun 312. The second variable capacitor 306, inductor 308 and diode 310 collectively form an adjustable matching or current trap circuit 314. The variable tuning capacitor 302 and the resonator capacitor 304 are serially coupled with the coil 204. In this embodiment, the variable tuning capacitor 302, resonator capacitor 304 and coil 204 are operably connected and configured to form a tunable resonator 316 having an adjustable resonant frequency.

To this end, the coil 204 can be approximated as an inductors. The inductance of a circular loop (L, in units henrys) is approximately:

$$L = \mu_0 a \left( \ln \frac{8a}{\rho} - 1.75 \right)$$

where $\rho$=wire radius, $\alpha$=loop radius, $\mu_0=4\pi\times10^{-7}$ H/m. As a practical example, for coils with radius between 2-8 cm and wire of 1-mm diameter, doubling the coil radius increases its inductance by a factor of approximately 2.3. For simplified analyses, it can be assumed that the coil dimension scales with inductance and the square of the quality factor, Q. Given the well-known resonance equation:

$$\omega^2 LC = 1$$

where $\omega$=angular frequency and C=capacitance, maintaining a resonant frequency requires scaling the tuning capacitance 302 inversely with the inductance of the coil 204. Thus, doubling the radius of a coil necessitates halving the tuning capacitance. This relation also approximates the parallel capacitance necessary to transform the impedance of the coil to 50 ohms. The required capacitance to match the coil to 50 ohms, C", can be expressed as $$C'' \cong \left( \frac{1}{50 Q L \omega^3} \right)^{0.5}$$

Accordingly, scaling the coil radius would approximately scale C" by a factor of $$\left( \frac{1}{a^{0.5+1}} \right)^{0.5} = a^{-1}$$

RF loop coils for MRI typically have inductance on the order of hundreds of nH and matching and tuning capacitance on the order of tens of pF. Initial stretchable coil prototypes demonstrated a 1.26:1 ratio of stretch-to-drape. Accordingly, the capacitors 202 preferably is configured to provide a capacitance that adjusts approximately 20-25% to cover a reasonable stretching range.

Figure 5:
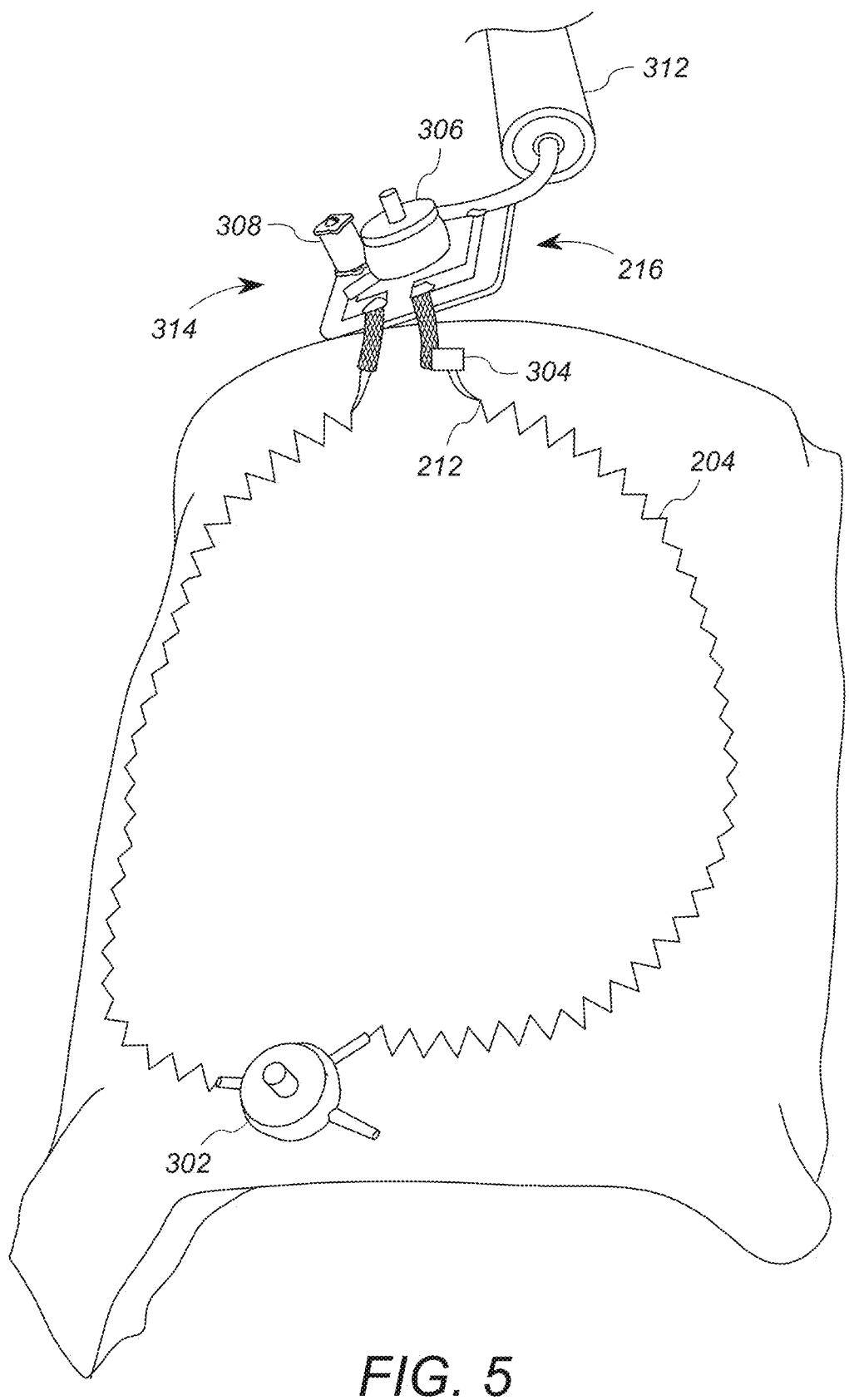
FIG. 5 shows an alternative embodiment of the RF detection apparatus according to embodiments described herein.

In this embodiment, the first and second ends 212, 214 of the coil 204 are operably coupled to first and second inputs 314a, 314b, respectively, of the matching circuit 314. The variable tuning capacitor 302 and the resonator capacitor 304 may suitably be coupled between either end 212, 214 and the respective matching circuit input 314a, 314b. Either or both of the capacitors 302, 304 may alternatively be coupled within the interior of the coil loop itself, as shown in FIG. 5. With reference to the matching/current trap circuit 314, the inductor 308 is serially coupled between the second input 314b and the balun 312. The second variable capacitor 306 is coupled across the two inputs 314a, 314b, and the diode 310 is coupled across the two inputs of the balun 312.

In general operation, the sleeve 202 can be placed over an appendage or other portion or the body so that the coil 304 is closest to the VOI of the subject. The variable capacitor 302 is then adjusted such that the resonant circuit 316 has a resonant frequency that corresponds to a frequency of interest of the MRI system 110, for example, the relevant Larmor frequency. To this end, it will be appreciated the electrical characteristics of the coil 204 necessarily change as a function of how much the coil 204 is stretched, and hence the radius of the loop is altered. Because the inductance of the coil 204 can be different for every patient, the resonant circuit 316 should be tuned via variable capacitor 302 for each use. Specific exemplary techniques of adjust the capacitor 302 are discussed further below in the Trials section.

Referring to FIG. 1, the MRI system 110 then causes the RF system 126 to transmit one more excitation RF pulses, as is known in the art, and the gradient system 124 causes magnetic gradients to be applied to the VOI of the subject. The RF probe 135, which includes the apparatus 200 of FIG. 2, detects the signal via the coil 204 and the resonator circuit 316. The matching circuit 314 and balun 312 operate to provide a balanced RF signal that includes information of the MRI images to the RF system 126, which then operates with the computing system 110 as described above to generate MRI image data.

Trials

Various experiments have been performed to show the efficacy of the apparatus 200. FIG. 5 shows a plan diagram of an apparatus 200' that is substantially electrically identical to the apparatus 200, and differs only in the placement of the capacitors 302, 304. In this embodiment, the variable tuning capacitor 302 is coupled approximately midway around the coil 204, and the resonator capacitor 304 is coupled external to the housing 316, which is shown in this embodiment as a circuit board.

Coil Design

The coil 204 of FIG. was formed of two 71-mm single-loop receive coils stitched on 90% polyester, 10% spandex athletic fabric. The conductor thread was Lyofil thread (silver-coated, p-phenylene benzobisoxazole (PBO), available from Syscom Advanced Materials Inc., Columbus, Ohio, USA) and standard polyester bobbin thread. In order to facilitate stretching, the stitch pattern 210 was a preset zigzag stitch on a Brother JX2517 sewing machine, available from Brother International Corporation, Bridgewater, N.J., USA. The stretched-to-draped coil radius ratio is 42.5:35.5 mm.

In the experiments a comparison prior art coil, not shown, was etched on flexible, 1-oz, 0.18-mm thick, copper-clad FR-4 printed circuit board (PCB) in a 76-mm (3-in) circle design with a trace width of 2.8 mm. The prior art coil was mounted to a custom 3D-printed half-cylindrical shell, with an inner diameter of 73 mm and outer diameter of 79 mm, designed to fit over a 1-L, 73-mm diameter, phantom bottle with an adhesive hook and loop fastener. All coils were segmented on opposite sides allowing for the attachment of the tuning/matching circuit 206 via the housing 216, and the variable capacitor 302, which was a model FC280832659, available from Vishay Intertechnology, Malvern, Pa. The 27-pF resonant capacitor 304 was added, in series, adjacent to the housing 216. The same elements were set up in the same way with the prior art coil.

The tuning/matching circuit 206 (see FIG. 4) also functions as a current trap, utilizing a 5-mm diameter tunable, unshielded inductor 308 model 00A06L, available from Coilcraft Inc., Cary, Ill., USA) and PIN diode 210, model MA4P7470E-1072T, available from MACOM, Lowell, Mass., USA. One quarter wavelength of coaxial cable, including the balun 312, connected the coil 204 upstream (i.e. to the RF system 126 of FIG. 1) via a BNC connector Coil Testing: Bench Measurements A network analyzer (E5071C, Keysight Technologies, Santa Rosa, Calif., USA) was utilized in the tuning of both the trap and coils. Prior to tuning the trap, an S11 measurement was employed to match and tune the coil resonator 316 to the Larmor frequency of hydrogen at 3 T (128 MHz) by adjusting the tuning capacitor 302. The tuning capacitor 302 was then removed to create an open circuit and an S22 measurement was taken using a small, single-loop probe lightly coupled to the inductor 308 and a second sniffer probe placed above the diode 310 (FIG. 4). A DC power supply, model 1685B, available from B&K Precision Corporation, Yorba Linda, Calif., USA was connected to a series 10-ohm resistor to drive the PIN diode circuit. 5 V was supplied to forward bias the diode and the trap 314 was tuned to 128 MHz using the second variable capacitor 306.

Subsequently, the tuning capacitor 302 was reattached and adjusted so that the coil resonator 316 was matched and tuned using an S11 measurement with a bias of −5 V. These measurements were repeated for all coils.

After the matching and tuning of the prior art coil and the coil 204 were completed, the coil quality factor (Q-factor) was calculated using the following formula, where $f_0$ is the resonant frequency (Hz) and $\Delta f_{-7\ dB}$ is the change in frequency (Hz) measured at the −7 dB crossings to the left and right of $f_0$:

$$Q = f_0 / \Delta f_{-7\ dB}$$

Q-factors were calculated in both unloaded and phantom-loaded states. The phantom was a 1-L bottle comprised of 16.7 g of NaCl and 538 grams of sugar dissolved in 700 mL of water, as determined using the NIH recipe generator to simulate the dielectric properties of human muscle, which has a permittivity of 63.5 and a conductivity of 0.719 S/m as determined through the IT'IS Foundation. 0.7 g of CuSO4 was added to shorten the longitudinal relaxation time ($T_1$). Muscle was chosen due to the future intent to use these coils for joint imaging. To consider the influence of variable proximity to the load for a rigid coil, the mounted PCB coil was positioned in two locations: wrapped tightly around the phantom and mounted 4.3 cm above the phantom.

Coil Testing: MRI Experiments

Coil testing was performed on an MRI system 100 in the form of a whole-body 3 T MR scanner (Discovery MR750, GE Healthcare, Chicago, Ill., USA). Each coil was connected individually to a receiver gateway box (16xRx, Clinical MR Solutions, Brookfield, Wis., USA) and positioned as previously described around the aforementioned muscle phantom (FIG. 4). The MRI system 100 executed a fast spin-echo (FSE) sequence was executed with the following parameters: echo time (TE) 120 ms, slice thickness 10 mm, pixel size 0.7 mm×0.7 mm, grid 256×256. The built-in body coil 134 was used to transmit, while the stitched coil 204 and prior art PCB coil were receive-only. All cases were acquired during the same scanning session and included a localizer, calibration, and FSE.

After scanning, data were imported into MATLAB (Mathworks, Natick, Mass., USA). Using in-house code, SNR was calculated following the alternate single-image SNR measurement procedure prescribed by NEMA. A 7×7-pixel region of signal and 11×11 pixel regions of noise were selected. The in-house code was validated by corresponding SNR calculations using OsiriX Lite (Pixmeo SARL, Geneva, Switzerland).

Coil Testing: Bench Measurements

Q-factor calculations from both the loaded and unloaded measurements are summarized in Table I below. Herebelow, the coil 204 is referred to as the "stitched coil" and the prior art coil is referred to as "PCB".

TABLE I

Q-FACTOR CALCULATIONS

| Coil | Loaded | Unloaded |
|---|---|---|
| PCB (Spaced 4.2 cm) | 116 | 153 |
| PCB | 45.8 | 153 |
| Stitched (Draped) | 35.4 | 53.0 |
| Stitched (Stretched) | 37.5 | 65.3 |

Coil Testing: MRI Experiments

Figure 6:
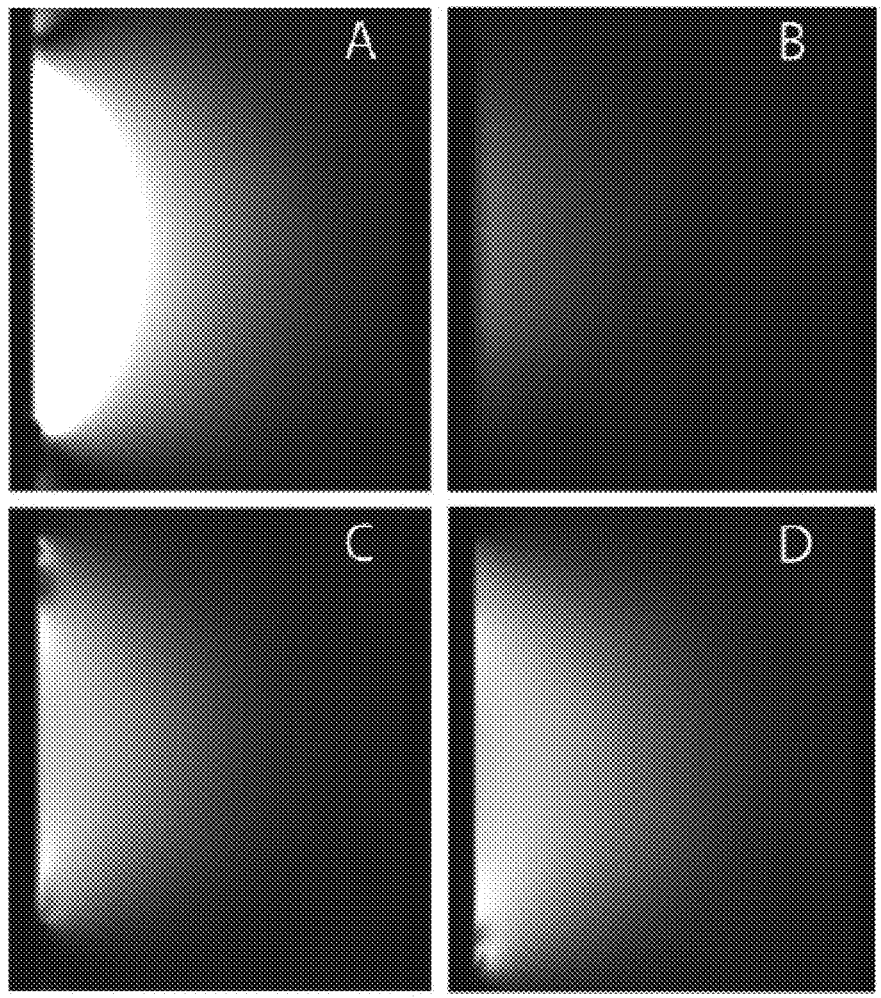
FIG. 6 show reconstructed images from magnetic resonant imaging operations performed with the RF detection apparatus of FIG. 5, and with a prior art detection apparatus.

FIG. 6 shows the resulting MR images gathered from the single-slice FSE sequence. All images have been set to have the same contrast and brightness for a faithful comparison. Notable in FIG. 6 are artifacts produced by capacitors 304 located at the top of the coil and 302 at the bottom of the coil. In order to deliberately visualize any extraneous fields that may be produced, the imaging slice was placed splitting the coil in half along the z-plane. While all of the coils do exhibit the same artifacts due to the capacitors, it does appear that the PCB coil has a greater signal value than the stitched coil 204. However, the PCB coil cannot be as readily placed adjacent to the patient, but rather must often be spaced from the patient by multiple centimeters. Moreover, the calculated SNR are similar between the draped coil 204 (unstretched) and PCB coils. The resulting SNR calculations are presented in Table II. Notably, the stretched coil 204 had a better SNR than the 4.2 cm spaced version of the PCB coil, which it most realistic.

TABLE II

SNR CALCULATIONS

| Coil | SNR |
|---|---|
| PCB (Spaced 4.2 cm) | 717 |
| PCB | 1070 |
| Stitched (Draped) | 923 |
| Stitched (Stretched) | 744 |

Given the right-fitting nature of a stretchable coil, separation of conductors and heat sources must be assured. Due to the zigzag stitching method, the conductive thread is anchored only to the top of the fabric 202, while the only thread that would potentially come in contact with a subject is nonconductive bobbin thread. However, the electric fields of capacitors must be characterized to prevent local tissue heating. The coil 204 and fabric 202 are washable, providing a hygienic aspect to the utilization of these coils, assuming any lumped elements and accessory boards/housings 316 are designed to be detachable. The stitch pattern 210 and thread have maintained their integrity across several stretched configurations.

In these experiments, all coils were mounted on a half cylindrical shell that fits over the phantom. The main purpose of this mounting was to maintain a consistent stretch and coil size for the stitched coils. This maintenance of size was crucial for matching and tuning, as well as maintaining such during the scans. In order to address variability in operating frequency due to coil stretching, strategies may be employed to dynamically match the coil, e.g., piezoelectric actuators, using methods discussed in G. A. Keith, C. T. Rodgers, A. T. Hess, C. J. Synder, J. T. Vaughan, M. D. Robson, "Automated tuning of an eight-channel cardiac transceiver array at 7 tesla using piezoelectric actuators", *Magn. Reson. Med.*, vol. 73, no. 6, pp. 2390-2397, (June 2015), or PIN diode circuit switches, as discussed in S. Ha, M. J. Hamamura, O. Nalcioglu, L. T. Muftuler, "A PIN diode controlled dual-tuned MRI RF coil and phased array for multi nuclear imaging.

The stitched coils 204, both draped and stretched, exhibited similar Q-factor values to the comparison PCB coil when loaded. There is a substantially higher unloaded Q-factor for the PCB coil when unloaded, which was expected given the lower resistivity of the copper trace compared to the conductive thread.

Given the close proximity to the phantom, the unshielded capacitors may affect image quality. Because artifacts are seen where the capacitors are placed (the spacing between the artifact sources was consistent with coil diameter), it would be beneficial to shield these components. The stretched coil did exhibit more noise than the draped coil indicating that stretching to the maximum capacity could impact image quality. The stretched-coil radius is approximately 26% larger than the radius of the draped-coil. With a larger coil, there is an increase in the total noise volume, yielding a lower SNR.

To verify that it was the coil size that impacted loaded SNR values in stitched and draped positions, comparison between the flux densities, B1, using the Biot-Savart law was performed. The flux density should be proportional to the loaded SNR measurements. This correlation was confirmed, as the ratio of stretched to draped B1 and SNR loaded is 1.24. Additionally, the increase in coil size increases the inductance of the coil and the Q-factor, which is reflected in Table I.

The Q-factor and SNR calculations for the PCB coiled spaced 4.2 cm above the phantom are important in illustrating that the coil proximity of placement to the skin has an impact on image quality. Even with a higher Q-factor than the stitched, stretchable coils, the SNR (Table II) was lower for the spaced PCB coil when compared to both stretchable coil configurations. This supports the notion that coils 204, which are designed to custom fit the anatomy of interest yield better images over rigid counterparts because they allow closer placement to the skin.

An RF coil 204 that is both stretchable and flexible can increase the utility of MRI for a broader range of applications beyond joint disease and injury. For example, while mammography has been the conventional method for breast cancer detection since the 1960s, MRI offers superior sensitivity, especially for denser breasts, and is recommended annually for screening high-risk women. Accordingly, a fully stretchable coil design may offer improvements for breast MRI across the diversity of forms and tissue densities present in the population, with enhanced SNR from the close skin placement.

The stretchable coils presented herein may be utilized to fabricate an array of receive elements. Orthogonal geometric decoupling between elements may be exploited for low channel count arrays, while several techniques may be employed for high channel count arrays, e.g., element overlap, resonant inductive decoupling, or self-decoupling through mutual impedance cancellation.

The experimentation demonstrates that the conductive thread and athletic material used for the apparatus 200 is a viable combination for an entirely stretchable coil. Creation of a saddle coil pair or a receive array coil are areas of continued research. While the advantages of stretchable coils are well-suited for joint imaging, these coils could be designed into a sports bra for breast imaging or a ski mask for brain imaging. The omnidirectional stretchable coil not only provides a significant advantage in the variety of positioning available across anatomy, but also for patient comfort. given the incorporation of fabrics commonly used in athletic wear.

It will be appreciated that the above described embodiments are merely illustrative, and that those of ordinary skill in the art may readily devise their own implementations and modifications that incorporate the principles of the invention and fall within the spirit and scope thereof.

By way of example, it will be appreciated that the RF detection apparatus 200 may be adapted for use in MRSI systems as well. Moreover, the RF detection apparatus 200 may be adapted for use in magnetic resonance systems that do not require the localization operations performed by the magnetic gradient system.

What is claimed is:

1. An apparatus for detecting RF signals in magnetic resonance testing procedures, comprising:
   a multidirectional stretchable fabric:
   a flexible RF coil having a coil shape, the coil RF coil comprising conductive fiber stitched into the stretchable fabric in a plurality of repeating, non-linear stitch patterns, the plurality stitch patterns collectively defining the coil shape.

2. The apparatus of claim 1, wherein the coil shape defines at least 90% of a complete loop.

3. The apparatus of claim 1, wherein, when the stretchable fabric is laid flat, the loop has a radius ratio from unstretched to stretched of at least approximately 6 to 7.

4. The apparatus of claim 1, wherein the conductive fiber includes a nonferromagnetic conductor disposed about a nonconductive thread.

5. The apparatus of claim 4, wherein the nonferromagnetic conductor comprises silver.

6. The apparatus of claim 5, wherein the nonconductive thread comprises polyester.

7. The apparatus of claim 4, wherein the conductor forms an outer layer having a thickness of 3 to 6 skin depths at a frequency of between 120 MHz and 300 MHz.

8. The apparatus of claim 4, wherein the non-linear stitch pattern is a zig-zag pattern.

9. The apparatus of claim 1, wherein the stretchable fabric includes at least 10% spandex.

10. An apparatus for detecting RF signals in magnetic resonance testing procedures, comprising:
    a multidirectional stretchable fabric:
    a flexible RF coil having a coil shape, the coil RF coil comprising conductive fiber stitched into the stretchable fabric in a plurality of repeating, non-linear stitch patterns, the plurality stitch patterns collectively defining the coil shape;
    at least one variable capacitor coupled in series with the flexible coil.

11. The apparatus of claim 10, further comprising a current trap circuit operably coupled to the flexible RF coil, the current trap configured to be coupled to an RF system of a magnetic resonance imaging system.

12. The apparatus of claim 10, wherein the multidirection stretchable fabric forms a sleeve having an interior for receiving at least a part of a human body.

13. The apparatus of claim 12, wherein the coil shape defines at least 90% of a complete loop.

14. The apparatus of claim 10, wherein the conductive fiber includes a nonferromagnetic conductor disposed about a nonconductive thread.

15. The apparatus of claim 14, wherein the nonferromagnetic conductor comprises silver.

16. The apparatus of claim 15, wherein the nonconductive thread comprises polyester.

17. The apparatus of claim 14, wherein the conductor forms an outer layer having a thickness of 3 to 6 skin depths at a frequency of between 120 MHz and 300 MHz.

18. The apparatus of claim 10, wherein the variable capacitor has an adjustability of at least 20 percent.

* * * * *